US012075628B2

(12) United States Patent
Xue et al.

(10) Patent No.: US 12,075,628 B2
(45) Date of Patent: Aug. 27, 2024

(54) MAGNETIC MEMORY DEVICES AND METHODS OF FORMATION

(71) Applicant: Applied Materials, Inc., Santa Clara, CA (US)

(72) Inventors: Lin Xue, San Diego, CA (US); Chando Park, Palo Alto, CA (US); Jaesoo Ahn, San Jose, CA (US); Hsin-wei Tseng, San Jose, CA (US); Mahendra Pakala, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 371 days.

(21) Appl. No.: 17/423,435

(22) PCT Filed: Jan. 16, 2020

(86) PCT No.: PCT/US2020/013791
§ 371 (c)(1),
(2) Date: Jul. 15, 2021

(87) PCT Pub. No.: WO2020/167405
PCT Pub. Date: Aug. 20, 2020

(65) Prior Publication Data
US 2022/0115439 A1 Apr. 14, 2022

Related U.S. Application Data

(60) Provisional application No. 62/806,435, filed on Feb. 15, 2019.

(51) Int. Cl.
*H10B 61/00* (2023.01)
*G11C 11/16* (2006.01)
(Continued)

(52) U.S. Cl.
CPC ............ *H10B 61/00* (2023.02); *G11C 11/161* (2013.01); *H10N 50/80* (2023.02); *H10N 50/85* (2023.02); *H10N 50/01* (2023.02)

(58) Field of Classification Search
CPC ....... H10B 61/00; G11C 11/161; G11C 11/18; H10N 50/80; H10N 50/85; H10N 50/01; H10N 50/10
See application file for complete search history.

(56) References Cited

U.S. PATENT DOCUMENTS

2005/0102720 A1   5/2005   Lee
2005/0104101 A1   5/2005   Sun et al.
(Continued)

FOREIGN PATENT DOCUMENTS

CN   106783862 A   5/2017
CN   107658382 B   10/2019
(Continued)

OTHER PUBLICATIONS

Japan Office Action, Application No. JP 2021-546689 dated Dec. 20, 2022.
(Continued)

*Primary Examiner* — David Vu
(74) *Attorney, Agent, or Firm* — Patterson + Sheridan, LLP

(57) ABSTRACT

Implementations of the present disclosure generally relate to a memory device. More specifically, implementations described herein generally relate to a SOT-MRAM. The SOT-MRAM includes a memory cell having a magnetic storage layer disposed side by side and in contact with a SOT layer. The side by side magnetic storage layer and the SOT layer can achieve the switching of the magnetic storage
(Continued)

layer by reversing the direction of the electrical current flowing through the SOT layer without any additional conditions.

20 Claims, 6 Drawing Sheets

(51) Int. Cl.
  *H10N 50/80* (2023.01)
  *H10N 50/85* (2023.01)
  *H10N 50/01* (2023.01)

(56) References Cited

U.S. PATENT DOCUMENTS

| | | |
|---|---|---|
| 2009/0251950 A1 | 10/2009 | Klostermann |
| 2013/0140615 A1 | 6/2013 | Kramer et al. |
| 2014/0198564 A1 | 7/2014 | Guo |
| 2014/0203341 A1 | 7/2014 | Guo |
| 2014/0210025 A1 | 7/2014 | Guo |
| 2014/0254252 A1 | 9/2014 | Guo |
| 2014/0254352 A1 | 9/2014 | Natarajan et al. |
| 2016/0079518 A1 | 3/2016 | Pi et al. |
| 2017/0076770 A1* | 3/2017 | Daibou ............... G11C 11/1675 |
| 2017/0125078 A1 | 5/2017 | Mihajlovic et al. |
| 2018/0040807 A1 | 2/2018 | Saito et al. |
| 2018/0123021 A1 | 5/2018 | Sasaki et al. |
| 2018/0301177 A1 | 10/2018 | Nakatsuji |
| 2019/0006581 A1 | 1/2019 | Eom et al. |
| 2020/0168664 A1* | 5/2020 | Noh ....................... H10B 61/00 |

FOREIGN PATENT DOCUMENTS

| | | |
|---|---|---|
| JP | 2001084756 A | 3/2001 |
| JP | 2003069107 A | 3/2003 |
| KR | 10-2014-0027036 A | 3/2014 |
| KR | 10-2020-0030277 A | 3/2020 |
| WO | 2017018391 A1 | 2/2017 |

OTHER PUBLICATIONS

Korea Office Action, Application No. KR 10-2021-7029452 dated Jan. 19, 2023.
Japanese Office Action for Application No. 2021-546689 dated Jul. 11, 2023.
Korea Office Action, Application No. KR 10-2021-7029452 dated Sep. 25, 2023.
Taiwan Office Action for Application No. 109103639 dated Nov. 3, 2023.
International Search Report and Written Opinion dated May 6, 2020 for Application No. PCT/US2020/013791.
Taiwan Office Action for Application No. 109103639 dated Mar. 15, 2024.
Chinese Office Action for Application No. 202080013786.4 dates Feb. 23, 2024.
Taiwan Office Action dated May 21, 2024 for Application No. 109103639.

* cited by examiner

MAGNETIC MEMORY DEVICES AND METHODS OF FORMATION

BACKGROUND

Field

Implementations of the present disclosure generally relate to a memory device. More specifically, implementations described herein generally relate to a spin-orbit torque magnetoresistive random-access memory (SOT-MRAM).

Description of the Related Art

Magnetoresistive random-access memory (MRAM) is a type of memory device containing an array of MRAM cells that store data using their resistance values instead of electronic charges. Generally, each MRAM cell includes a magnetic tunnel junction (MTJ) structure having at least one magnetic storage layer (free layer) and one magnetic reference layer (pinned layer). MTJ structure may have adjustable resistance to represent a logic state "0" or "1", which is achieved by switching the magnetic moment of the magnetic storage layer from a parallel direction with respect to the magnetic moment of the magnetic reference layer to an anti-parallel direction with respect to the magnetic moment of the magnetic reference layer. MRAM can take various forms, such as spin-transfer torque MRAM (STT-MRAM) or SOT-MRAM.

Conventionally, in SOT-MRAM, the magnetic storage layer is disposed on a spin-orbit torque (SOT) layer. A SOT is generated by the electrical current flowing along the SOT layer due to the strong spin-orbit coupling of the SOT layer. Magnetic storage of MRAM cell is often made with perpendicular magnetic anisotropy (PMA) material with magnetic moment perpendicular to the substrate plane. Spin polarization generated in the magnetic storage layer by the spin-orbit coupling is orthogonal to the magnetic moment of the PMA magnetic storage layer. Thus, the SOT generated by the SOT layer cannot switch the magnetic moment of the PMA magnetic storage layer due to the symmetric switching (the amount of spin current to switch from the magnetic moment of the magnetic storage layer from the parallel state to the anti-parallel state is the same as the amount of spin current to switch from the anti-parallel state to the parallel state). One or more additional conditions, such as an external magnetic field or spin transfer torque from additional structures, are needed to break the symmetry and to switch the magnetic moment of the magnetic storage layer.

Therefore, an improved SOT-MRAM is needed.

SUMMARY

Implementations of the present disclosure generally relate to a memory device. More specifically, implementations described herein generally relate to a SOT-MRAM. In one implementation, a memory device includes a SOT-MRAM cell array having a magnetic storage layer and a first lead disposed side by side and in contact with the magnetic storage layer.

In another implementation, a memory device includes a SOT-MRAM cell array having a contact, a magnetic reference layer disposed on the contact, a barrier layer disposed on the magnetic reference layer, a magnetic storage layer disposed on the barrier layer, and a lead disposed side by side and in contact with the magnetic storage layer.

In another implementation, a memory device includes a SOT-MRAM cell array having a first lead, a magnetic storage layer disposed side by side and in contact with the first lead, a barrier layer disposed on the first lead and the magnetic storage layer, a magnetic reference layer disposed on the barrier layer, and a second lead disposed on the magnetic reference layer.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

Figure 1:
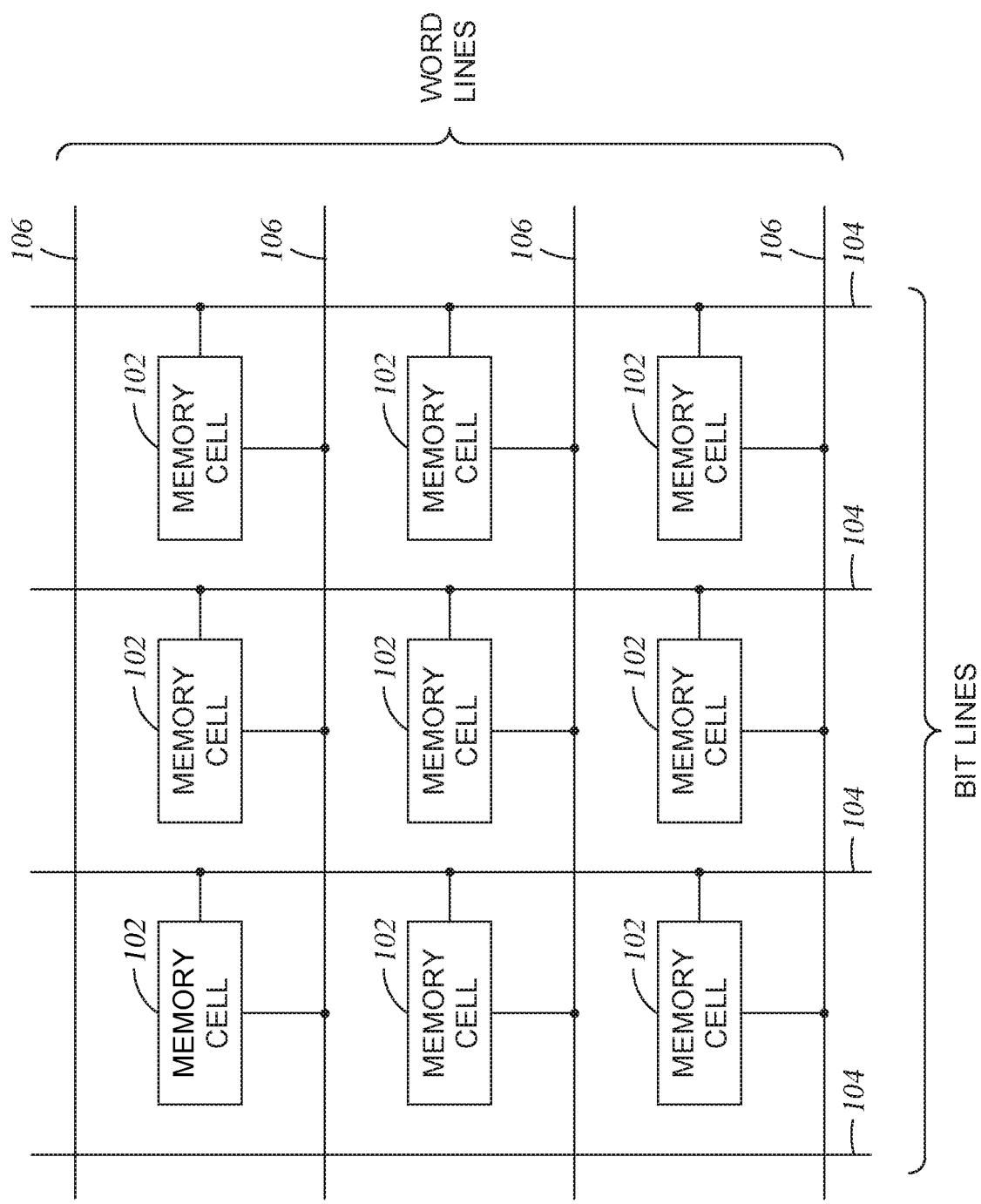
FIG. 1 is a schematic diagram of a memory cell array.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations of the present disclosure generally relate to a storage device. More specifically, Implementations described herein generally relate to a SOT-MRAM. The SOT-MRAM includes a memory cell having a magnetic storage layer disposed side by side and in contact with a SOT layer. The side by side magnetic storage layer and the SOT layer can achieve the switching of the magnetic storage layer by reversing the direction of the electrical current flowing through the SOT layer without any additional conditions.

FIG. 1 is a schematic diagram of a memory cell array 100. The memory cell array 100 may be a portion of a SOT-MRAM cell and chip architecture. The memory cell array 100 includes a plurality of first leads 104, a plurality of second leads 106, and a plurality of memory cells 102. The plurality of first leads 104 may be substantially parallel among each other, the plurality of second leads 106 may be substantially parallel among each other, and each first lead 104 may be substantially perpendicular to each second lead 106. The plurality of first leads 104 may be disposed over the plurality of second leads 106. The plurality of first leads 104 may be bit lines and the plurality of second leads 106 may be word lines. Four first leads 104 and four second leads 106 are illustrated in FIG. 1, but the memory cell array 100 may include more than four first leads 104 and second leads 106.

Figure 2:
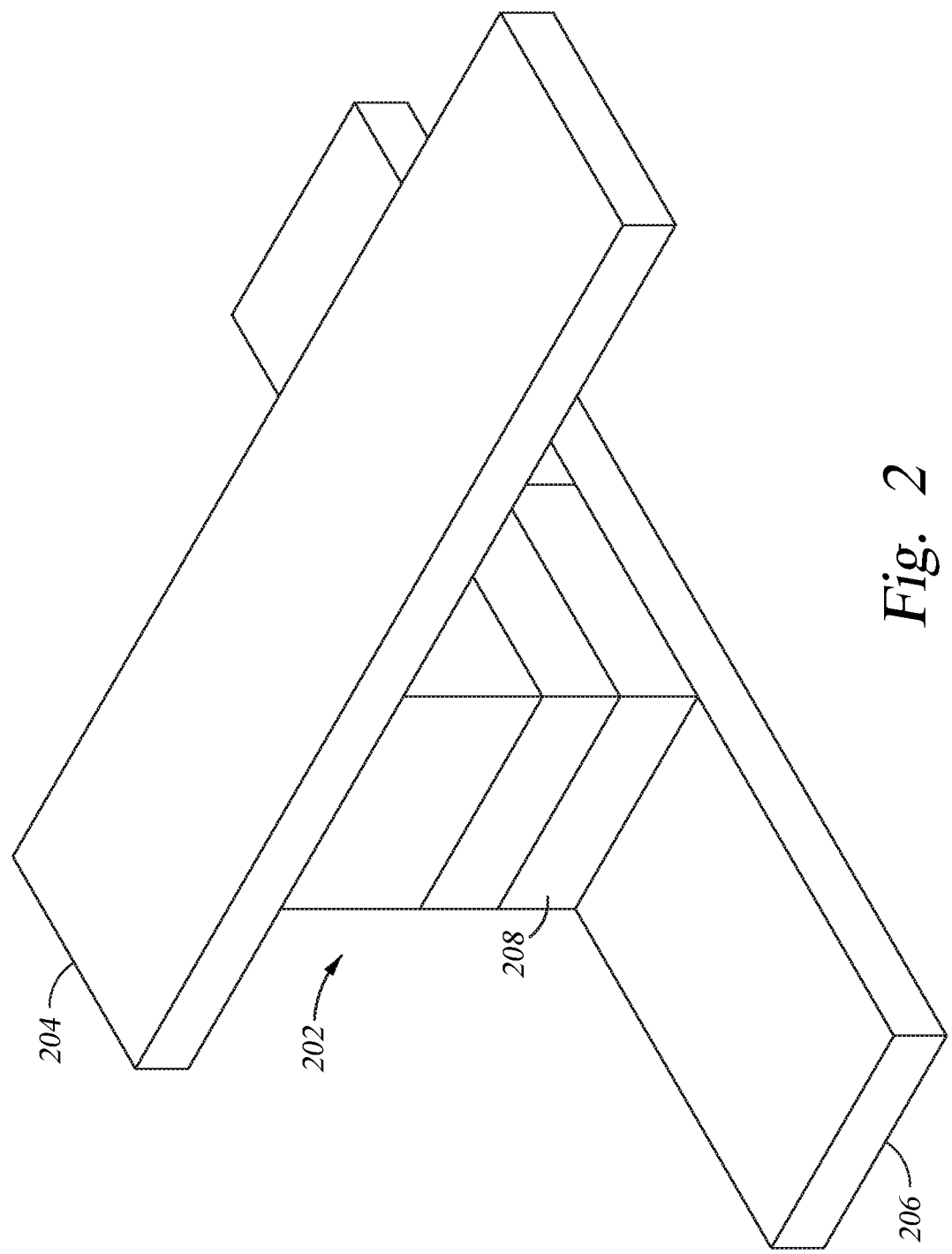
FIG. 2 is a schematic perspective view of a conventional memory cell.

FIG. 2 is a schematic perspective view of a conventional memory cell 202. As shown in FIG. 2, the conventional memory cell 202 is disposed between a first lead 204 and a second lead 206. The conventional memory cell 202 includes a magnetic storage layer 208 disposed on the second lead 206.

Figure 3:
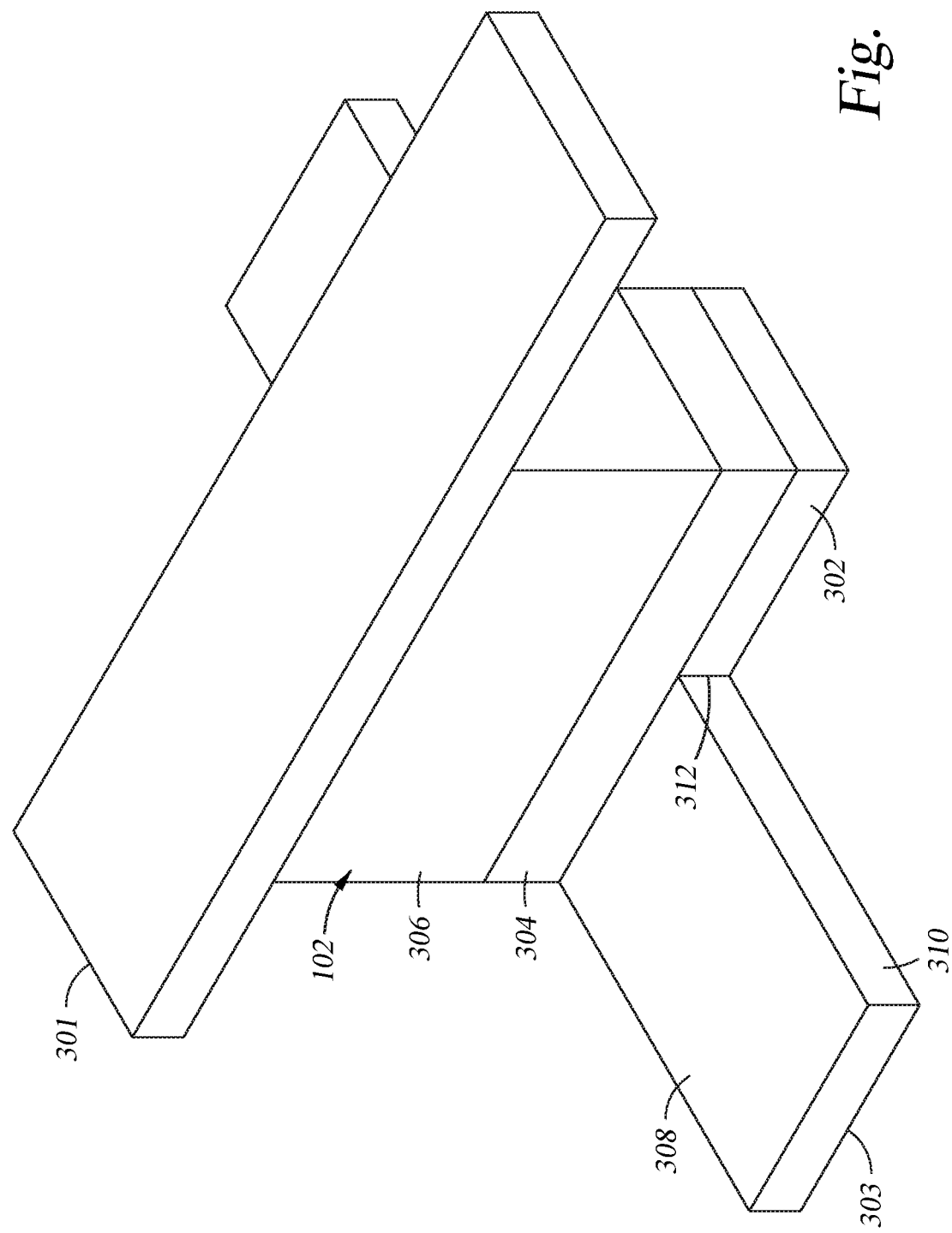
FIG. 3 is a schematic perspective view of a memory cell.

FIG. 3 is a schematic perspective view of the memory cell 102. As shown in FIG. 3, the memory cell 102 is in contact with a first lead 301 and the second lead 303. The second lead 303 is fabricated from a material having strong spin-orbit coupling, such as a metal or a metal alloy. In one example, the second lead 303 is fabricated from platinum, tantalum, tungsten, palladium, or iridium. In another example, the second lead 303 is fabricated from a metal alloy containing one or more metals such as platinum, tantalum, tungsten, palladium, molybdenum, copper, gold, silver, ruthenium, iridium, manganese, bismuth, antimony, tellurium, hafnium, magnesium, or selenium. In one example, the second lead 303 is a SOT layer, and the memory cell 102 is a SOT-MRAM cell. The first lead 301 is fabricated from an electrically conductive material, such as tantalum nitride, titanium nitride, tungsten nitride, or other suitable material. In one example, the first lead 301 is fabricated from a metal. The first lead 301 is fabricated from a different material than the material of the second lead 303. In one example, the first lead 301 is the first lead 104 shown in FIG. 1, and the second lead 303 is the second lead 106 shown in FIG. 1.

The memory cell 102 may include a magnetic storage layer 302, a barrier layer 304, and a magnetic reference layer 306. The magnetic storage layer 302, the barrier layer 304, and the magnetic reference layer 306 form a MTJ. The magnetic storage layer 302 and the magnetic reference layer 306 are fabricated from a ferromagnetic material, such as a metal alloy with dopants, such as boron dopants, oxygen dopants or other suitable materials. Metal alloys may contain nickel (Ni), platinum (Pt), ruthenium (Ru), cobalt (Co), iron (Fe), tantalum (Ta), or palladium (Pd). Suitable examples of the ferromagnetic materials include Ru, Ta, Co, Pt, TaN, NiFeOx, NiFeB, CoFeOxB, CoFeB, CoFe, NiOxB, CoBOx, FeBOx, CoFeNiB, CoPt, CoPd, TaOx and the like. In one example, the magnetic storage layer 302 and the magnetic reference layer 306 are fabricated from Co, Fe, Ni, or alloys thereof. The barrier layer 304 may be fabricated from a dielectric material for a tunnel junction magnetoresistive (TMR) sensor or from a conductive material for a giant magnetoresistive (GMR) sensor. If the memory cell 102 is a TMR sensor, the barrier layer 304 is fabricated from MgO, $HfO_2$, $TiO_2$, $Ta_2O_5$, $Al_2O_3$, or other suitable material. If the memory cell 102 is a GMR sensor, the barrier layer 304 is fabricated from copper, silver, or other suitable material.

As shown in FIG. 3, the magnetic storage layer 302 is disposed side by side and in contact with the second lead 303. The second lead 303 has a first surface 308 facing the first leads 301 and a second surface 310 connected to the first surface 308. In one example, the second surface 310 is substantially perpendicular to the first surface 308. The magnetic storage layer 302 has a first surface 312 in contact with the second surface 310 of the second lead 303. In one example, the second surface 310 corresponds to a thickness dimension of the second lead 303, and the second lead 303 is deposited, or grown, in the thickness dimension. As shown in FIG. 3, at least two surfaces 308, 310 of the second lead 303 are in contact with the memory cell 102. In one example, the memory cell 102 is a three-terminal SOT-MRAM memory cell, and the leads 301, 303 are connected to access transistors or an access transistor and a diode.

Figure 4A:
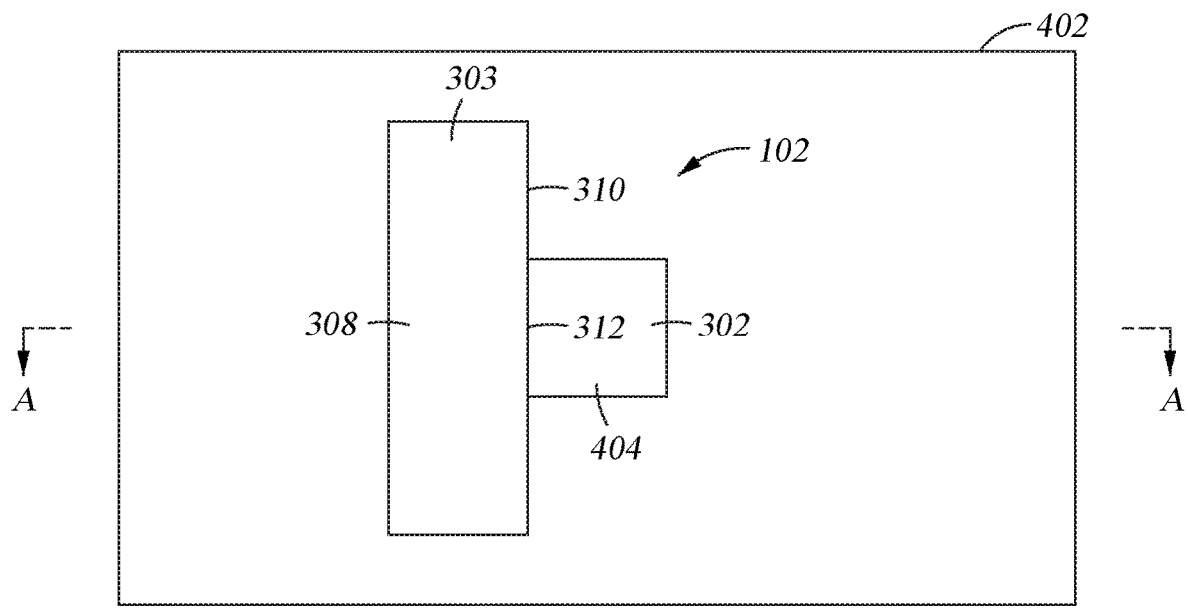
FIG. 4A is a schematic top view of a portion of the memory cell shown FIG. 3.
Figure 4B:
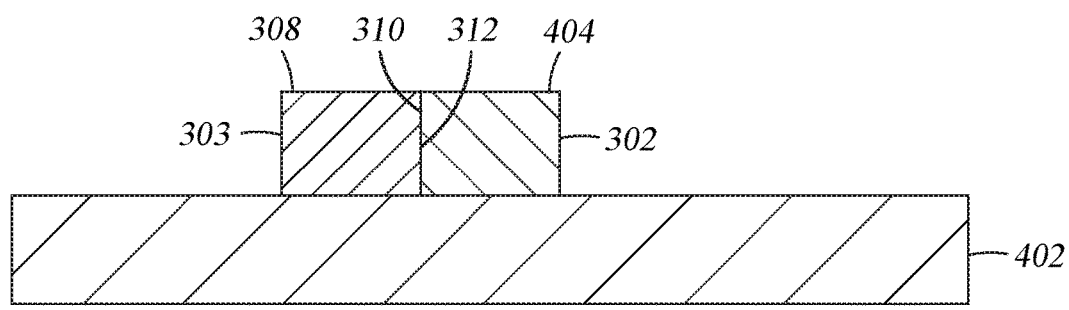
FIG. 4B is a schematic cross-sectional side view of the portion of the memory cell shown in FIG. 4A.

FIG. 4A is a schematic top view of a portion of the memory cell 102 shown in FIG. 3, and FIG. 4B is a schematic cross-sectional side view of the portion of the memory cell 102 along a line A-A shown in FIG. 4A. As shown in FIGS. 4A and 4B, the second lead 303 and the magnetic storage layer 302 are disposed side by side and in contact with each other on a substrate 402. The substrate 402 may include one or more transistors formed thereon, and the second lead 303 and the magnetic storage layer 302 may be disposed on a dielectric material, such as an oxide, for example silicon oxide. The second lead 303 and the magnetic storage layer 302 may be fabricated by any suitable method. In one example, a blanket layer is formed on the substrate 402. The blanket layer is fabricated from the same material as the magnetic storage layer 302. The blanket layer is then patterned to form the magnetic storage layer 302. The second lead 303 is then deposited on the substrate 402. In another example, a blanket layer is formed on the substrate 402. The blanket layer is fabricated from the same material as the second lead 303. The blanket layer is then patterned to form the second lead 303. The magnetic storage layer 302 is then deposited on the substrate 402.

The second lead 303 includes the first surface 308 and the second surface 310 substantially perpendicular to the first surface 308. The magnetic storage layer 302 includes the first surface 312 in contact with the second surface 310 of the second lead 303. The magnetic storage layer 302 also includes a second surface 404 connected to the first surface 312, as shown in FIG. 4B. In one example, the second surface 404 is substantially perpendicular to the first surface 312. The second surface 404 may face the first lead 301. In one example, the second surface 404 is substantially coplanar with the first surface 308 of the second lead 303, and a layer, such as a the barrier layer 304 (shown in FIG. 3) may be disposed on both surfaces 308, 404. With the side by side magnetic storage layer 302 and the second lead 303 (a SOT layer), the SOT generated by the second lead 303 and the magnetic moment of the magnetic storage layer 302 are both perpendicular to the substrate 402, which can achieve switching of the magnetic storage layer 302 by reversing the direction of the electrical current flowing through the second lead 303 without any additional conditions.

Figure 5A:
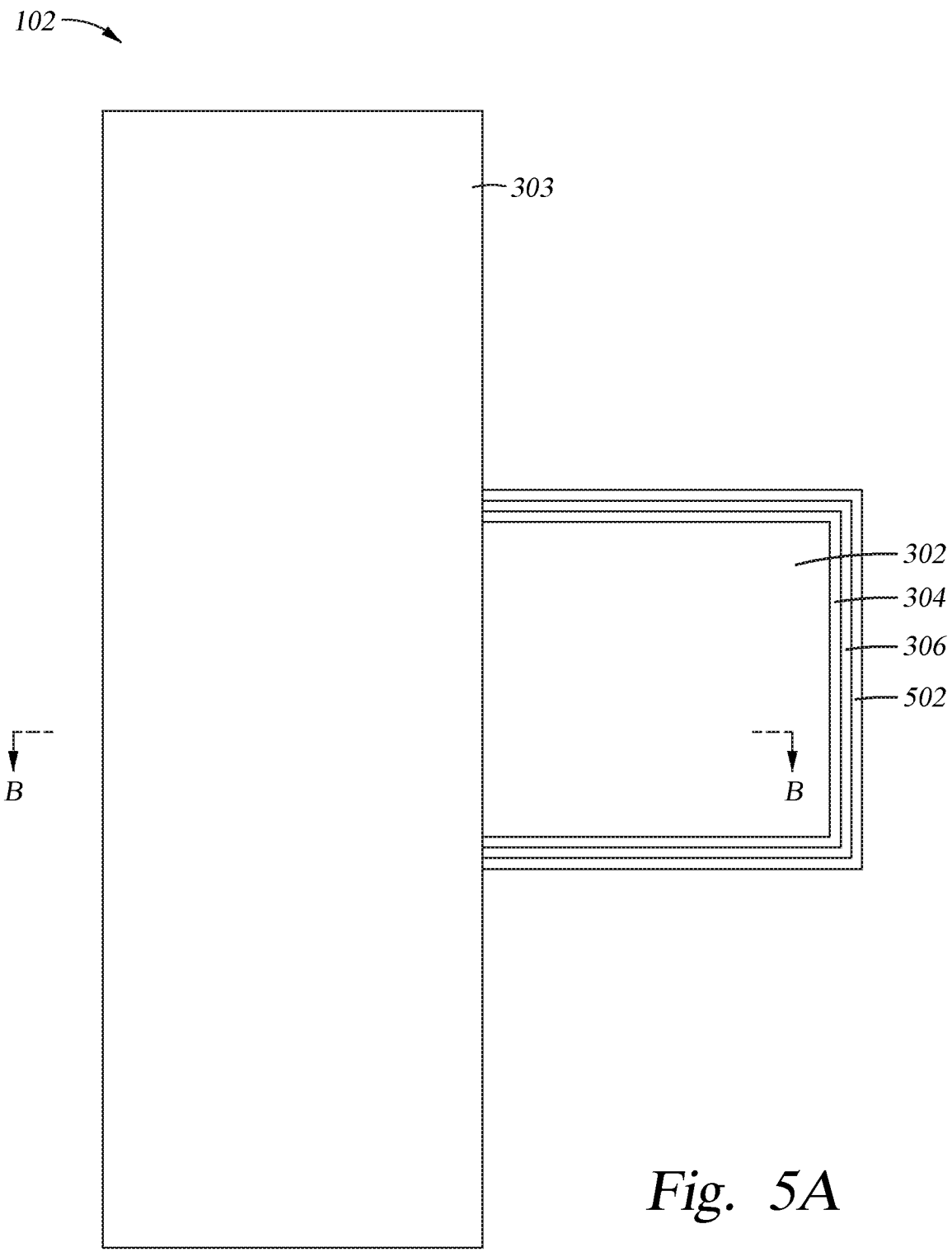
FIG. 5A is a schematic top view of a memory cell.
Figure 5B:
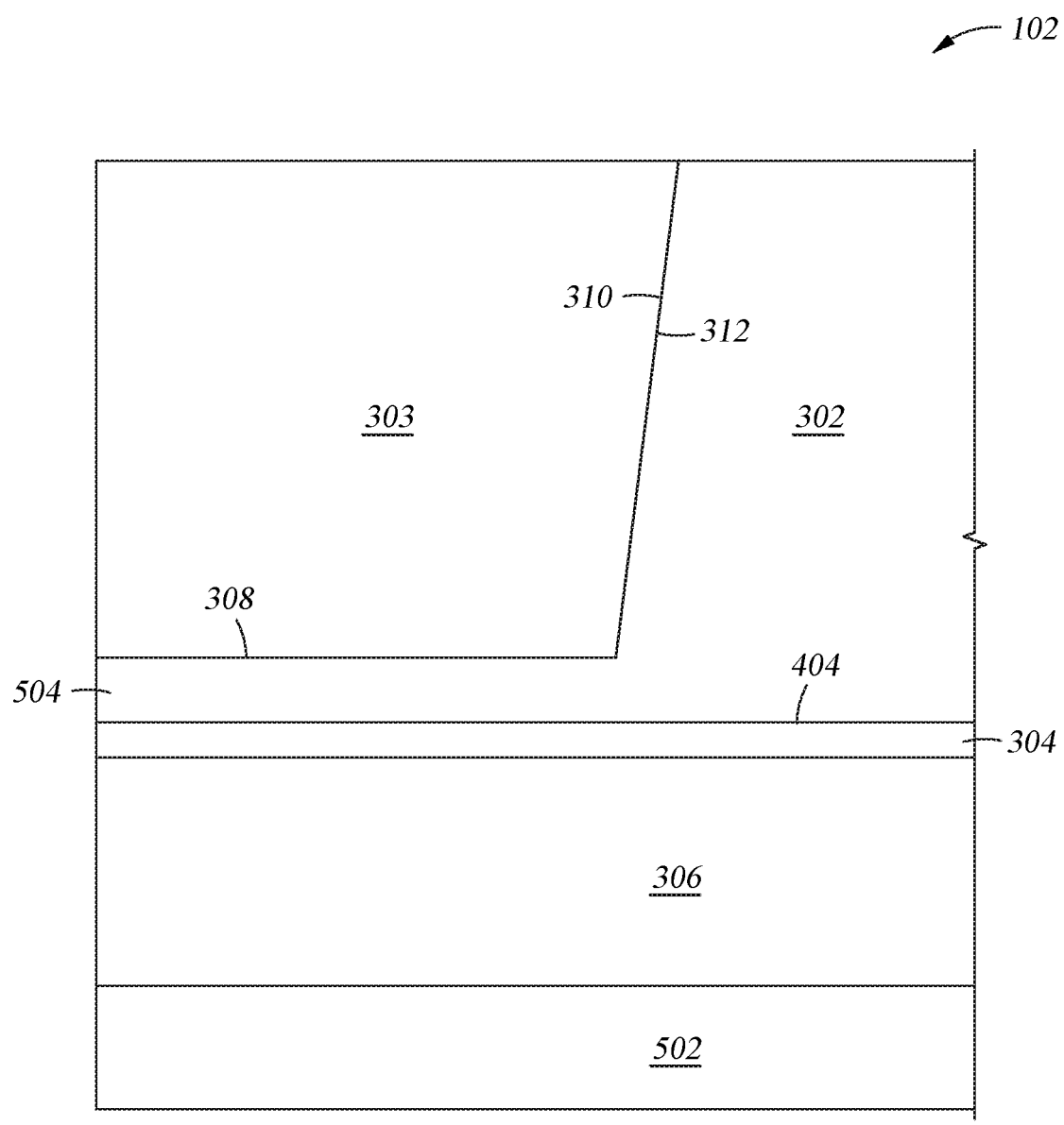
FIG. 5B is a schematic cross-sectional side view of the memory cell shown in FIG. 5A.

FIG. 5A is a schematic top view of a portion of the memory cell 102 according to another implementation, and FIG. 5B is a schematic cross-sectional side view of the portion of the memory cell 102 along a line B-B shown in FIG. 5A. As shown in FIGS. 5A and 5B, the second lead 303 and the magnetic storage layer 302 are disposed side by side and in contact with each other. The magnetic storage layer 302 includes a portion 504 extending below the second lead 303. The first surface 308 of the second lead 303 is disposed on and in contact with the portion 504 of the magnetic storage layer 302. The second surface 310 of the second lead 303 is in contact with the first surface 312 of the magnetic storage layer 302. The second surface 310 of the second lead 303 form an angle A with respect to the first surface 308 of the second lead 303. In one example, the angle A is about 90 degrees. In another example, the angle A is acute. In yet another example, the angle A is obtuse.

The magnetic storage layer 302 and the second lead 303 are disposed over the barrier layer 304, as shown in FIG. 5B. The second surface 404 of the magnetic storage layer 302 may be in contact with the barrier layer 304. The barrier layer 304 is disposed on the magnetic reference layer 306, and the magnetic reference layer 306 is disposed on a contact 502. In one example, the contact 502 is the first lead 301.

With the side by side magnetic storage layer and SOT layer, the SOT generated by the SOT layer and the magnetic moment of the magnetic storage layer are parallel to each other, which can achieve switching of the magnetic storage layer by reversing the direction of the electrical current flowing through the SOT layer without any additional conditions.

While the foregoing is directed to implementations of the present disclosure, other and further implementations of the disclosure may be devised without departing from the basic scope thereof, and the scope thereof is determined by the claims that follow.

What is claimed is:

1. A memory device, comprising:
    a spin-orbit torque magnetoresistive random-access memory cell, comprising:
        a magnetic storage layer;
        a first lead disposed side by side and in contact with the magnetic storage layer;
        a barrier layer disposed in contact with both the first lead and the magnetic storage layer; and
        a substrate disposed below and in contact with each of the magnetic storage layer and the first lead.

2. The memory device of claim 1, wherein the magnetic storage layer comprises Co, Fe, Ni, or combinations thereof.

3. The memory device of claim 1, wherein the first lead comprises platinum, tantalum, tungsten, palladium, iridium, or a metal alloy comprising platinum, tantalum, tungsten, palladium, molybdenum, copper, gold, silver, ruthenium, iridium, manganese, bismuth, antimony, tellurium, hafnium, magnesium, or selenium.

4. The memory device of claim 1, wherein the first lead comprises a first surface and a second surface substantially perpendicular to the first surface, and the first surface is configured to face a second lead.

5. The memory device of claim 4, wherein the magnetic storage layer comprises a first surface and a second surface substantially perpendicular to the first surface.

6. The memory device of claim 5, wherein the first surface of the magnetic storage layer is configured to face the second lead, and the second surface of the magnetic storage layer is in contact with the second surface of the first lead.

7. A memory device, comprising:
    a spin-orbit torque magnetoresistive random-access memory cell, comprising:
        a contact;
        a magnetic reference layer disposed on the contact;
        a barrier layer having a bottom surface in contact with the magnetic reference layer
        a magnetic storage layer disposed on the barrier layer;
        a lead disposed side by side and in contact with the magnetic storage layer, wherein the bottom surface of the barrier layer is in contact with the lead; and
        a substrate disposed below and in contact with each of the magnetic storage layer and the lead.

8. The memory device of claim 7, wherein the magnetic storage layer and the magnetic reference layer each comprises Co, Fe, Ni, or combinations thereof.

9. The memory device of claim 7, wherein the lead comprises platinum, tantalum, tungsten, palladium, iridium, or a metal alloy comprising platinum, tantalum, tungsten, palladium, molybdenum, copper, gold, silver, ruthenium, iridium, manganese, bismuth, antimony, tellurium, hafnium, magnesium, or selenium.

10. The memory device of claim 7, wherein the barrier layer comprises $MgO$, $HfO_2$, $TiO_2$, $Ta_2O_5$, or $Al_2O_3$.

11. The memory device of claim 7, wherein the barrier layer comprises copper or silver.

12. The memory device of claim 7, wherein the lead comprises a first surface facing the contact and a second surface connected to the first surface.

13. The memory device of claim 12, wherein the magnetic storage layer comprises a first surface facing the contact and a second surface connected to the first surface.

14. The memory device of claim 13, wherein the second surface of the magnetic storage layer is in contact with the second surface of the lead.

15. The memory device of claim 13, wherein the second surface of the magnetic storage layer is in contact with the second surface of the lead.

16. A memory device, comprising:
    a spin-orbit torque magnetoresistive random-access memory cell, comprising:
        a first lead;
        a magnetic storage layer disposed side by side and in contact with the first lead;
        a barrier layer disposed in contact with the first lead and the magnetic storage layer;
        a magnetic reference layer disposed on the barrier layer;
        a second lead disposed on the magnetic reference layer; and
    a substrate disposed below and in contact with each of the magnetic storage layer and the first lead.

17. The memory device of claim 16, wherein the magnetic storage layer and the magnetic reference layer each comprises Co, Fe, Ni, or combinations thereof.

18. The memory device of claim 16, wherein the first lead comprises platinum, tantalum, tungsten, palladium, iridium, or a metal alloy comprising platinum, tantalum, tungsten, palladium, molybdenum, copper, gold, silver, ruthenium, iridium, manganese, bismuth, antimony, tellurium, hafnium, magnesium, or selenium.

19. The memory device of claim 16, wherein the barrier layer comprises $MgO$, $HfO_2$, $TiO_2$, $Ta_2O_5$, or $Al_2O_3$.

20. The memory device of claim 16, wherein the barrier layer comprises copper or silver.

* * * * *